United States Patent [19]

Nishizawa

[11] Patent Number: 4,631,592
[45] Date of Patent: Dec. 23, 1986

[54] SEMICONDUCTOR IMAGE SENSOR

[75] Inventor: Jun-ichi Nishizawa, Sendai, Japan

[73] Assignee: Fuji Photo Film Co., Ltd., Minami-Ashigara, Japan

[21] Appl. No.: 793,239

[22] Filed: Oct. 31, 1985

Related U.S. Application Data

[63] Continuation of Ser. No. 527,574, Aug. 16, 1983, Pat. No. 4,562,474.

[30] Foreign Application Priority Data

Dec. 17, 1981 [JP] Japan .............................. 56-204656

[51] Int. Cl.⁴ .............................. H01L 27/14
[52] U.S. Cl. .............................. 358/213; 357/30
[58] Field of Search .................. 358/213; 357/24 LR, 357/22 B, 22 C, 30

[56] References Cited

U.S. PATENT DOCUMENTS

| | | | |
|---|---|---|---|
| 4,360,821 | 11/1982 | Tsukada | 357/24 LR |
| 4,377,817 | 3/1983 | Nishizawa | 357/30 |
| 4,388,532 | 6/1983 | Garcia | 357/24 LR |
| 4,412,236 | 10/1983 | Sasano | 357/24 LR |
| 4,450,464 | 5/1984 | Nishizawa | 357/30 |
| 4,450,466 | 5/1984 | Nishizawa | 357/30 |
| 4,454,526 | 6/1984 | Nishizawa | 357/30 |
| 4,499,654 | 2/1985 | Nishizawa | 357/30 |

FOREIGN PATENT DOCUMENTS

| | | | |
|---|---|---|---|
| 47-36718 | 11/1972 | Japan . | |
| 51-13538 | 11/1976 | Japan . | |
| 57-53183 | 3/1982 | Japan | 358/213 |
| 57-19468 | 11/1982 | Japan | 358/213 |

OTHER PUBLICATIONS

J. Nishizawa et al., "SIT Image Converter," Ohmsha, Ltd. Publisher, 1983, pp. 219–242.

Primary Examiner—Gene Z. Rubinson
Assistant Examiner—L. C. Schroeder
Attorney, Agent, or Firm—Staas & Halsey

[57] ABSTRACT

A semiconductor image sensor which has photocells arranged in a matrix form is miniaturized and integrated with high density, thereby to increase its light amplification factor and operating speed. To this end, each photocell is formed by a static induction transistor which has a pair of main electrodes, a channel region formed between the main electrodes and a capacitor connected between a control region serving as a photocell and one of the row lines.

12 Claims, 15 Drawing Figures

SEMICONDUCTOR IMAGE SENSOR

This is a continuation of co-pending application Ser. No. 527,574 filed on Aug. 16, 1983, now U.S. Pat. No. 4,562,474.

BACKGROUND OF THE INVENTION

The present invention relates to a semiconductor image sensor which is characterized in that cells are each formed by using a static induction transistor as a light detecting and switching element.

A conventional semiconductor image sensor has each cell formed by a light detecting diode and a switching MOS transistor, and possesses the defect of low sensitivity because light detection is carried out by the diode. Since the MOS transistor is used for the switching operation, switching noise is larger than the signal of the light and removal of the noise is difficult. For the reason mentioned above, the use of the cell formed by the light detecting diode and the MOS transistor imposes limitations on the integration density from the viewpoint of sensitivity.

SUMMARY OF THE INVENTION

An object of the present invention is to provide a semiconductor image sensor of the one cell-one transistor type which employs a static induction transistor of high photosensitivity for both light detection and switching operations.

Another object of the present invention is to provide a semiconductor image sensor which is suitable for miniaturization and for high integration density.

Another object of the present invention is to provide a semiconductor image sensor of a large light amplification factor.

Still another object of the present invention is to provide a semiconductor image sensor which permits high-speed readout.

In the semiconductor image sensor of the present invention, a matrix is formed by a plurality of row lines and a plurality of column lines and, at each intersection of the matrix, a static induction transistor is provided which has a first main electrode connected to one of the column lines and the other main electrode connected in common to the other main electrodes of the other static induction transistors, a channel region disposed between the main electrodes and a capacitor connected between a control region serving as a photocell and one of the row lines. The first main electrode of a respective switching transistor is connected to each one of the column lines and another main electrode of all these switching transistors are connected in common, and connected via a load resistor to a power source. The gate or base of each switching transistor is connected to a video line selecting circuit and the gate of each photocell is connected via the capacitor to a readout address circuit.

The semiconductor image sensor of the present invention has such features as follows:

(1) the semiconductor image sensor of the present invention has each photocell formed by one transistor and one capacitor, and hence is simple in construction; and (2) the light amplifying action is large and resistant to noise.

Thus the semiconductor image sensor of the present invention is simple in construction has a light amplifying action, possesses characteristics unobtainable with conventional semiconductor devices, and hence is of great industrial value.

DESCRIPTION OF THE PREFERRED EMBODIMENTS

Figure 1A:
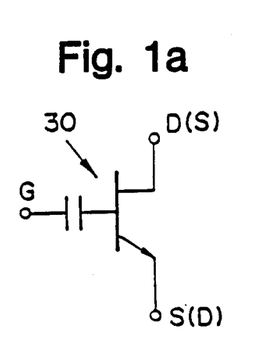
FIGS. 1(a) is a diagram showing a photocell for use in the semiconductor image sensor of the present invention.
Figure 1B:
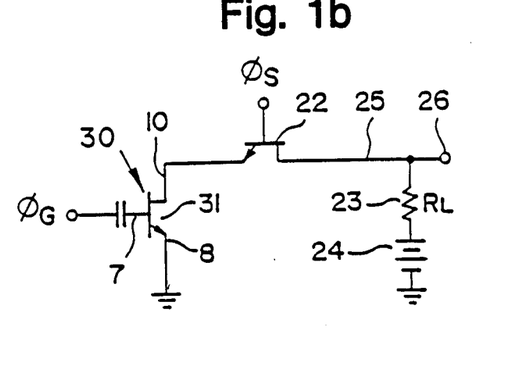
FIG. 1(b) is a diagram explanatory of the construction of the semiconductor image sensor of the present invention.

FIGS. 1(a) and (b) illustrate embodiments of a transistor of a cell portion and the circuit structure of one cell portion of the semiconductor image sensor of the present invention, respectively.

FIG. 1(a) shows an n-channel static induction transistor which has its gate connected to a capacitor and has what is called normally OFF characteristic such that current is difficult to flow even if the gate voltage is zero. Voltage is applied between the drain and the source and, when light input 30 is applied, holes of electron-hole pairs created in the channel are stored in the gate region. That is, when the transistor is put in the ON state by applying voltage between the drain and the source and a forward voltage between the gate and the source, a drain-to-source current flows corresponding to the number of holes stored in the gate region, carrying out the amplification of light. The light amplification factor becomes as high as $10^3$ or more; namely, the sensitivity of the static induction transistor is one or more orders of magnitude higher than the sensitivity of a conventional phototransistor formed by a bipolar transistor. The capacitor connected to the gate is for cutting off direct current and for storing the light signal.

FIG. 1(b) illustrates the basic structure of the present invention. Reference numeral 31 indicates the static induction transistor shown in FIG. 1(a), 22 a switching transistor, 23 a load resistor, 24 a video voltage source, 25 a lead (a video line) between the switching transistor 22 and the load resistor 23, $\phi_S$ a pulse voltage which is applied to the gate of the switching transistor 22, and $\phi_G$ a pulse voltage which is applied to the gate of the transistor 31.

Holes optically excited by the light input 30 flow into the gate region of the phototransistor 31 to write therein the light signal. The pulse voltage $\phi_S$ is provided to the gate of the transistor 22 to conduct it to apply the voltage of the video voltage source 24 to the photo transistor 31. At this time, the pulse voltage $\phi_G$ is not applied. When the pulse voltage $\phi_G$ is provided to conduct the static induction transistor 31, a drain current is caused to flow corresponding to the light input, producing a light output signal from an output terminal 26.

The light output at the output terminal 26 varies with the intensity of the light input 30 and a characteristic of a wide dynamic range could be obtained.

Figure 1C:
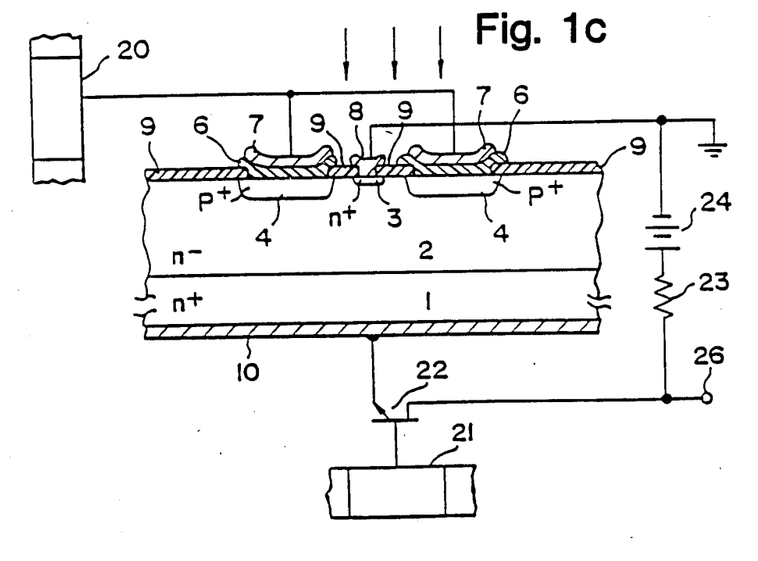
FIGS. 1(c) and (d) are cross-sectional view of the principal parts of the photocell for use in the semiconductor image sensor of the present invention.

FIG. 1(c) illustrates an embodiment of the semiconductor image sensor of the present invention, showing in section the semiconductor device of the cell and a circuit structure necessary for operation. Reference numeral 1 indicates an n+ substrate of silicon, 2 a high resistance n− layer (or an intrinsic semiconductor region and a region which will ultimately form a channel), 3 a high impurity density n+ region which will ultimately form a source region, 4 a high impurity density p+ region which is so shaped as not to close the channel region and will ultimately form a control gate, 6 an insulator, such as SiO, 7, 8 and 10 gate, source and drain electrodes, and 9 an SiO$_2$ film.

Reference numeral 20 denotes a read address circuit which generates the readout gate pulse voltage $\phi_G$, and 21 a circuit which generates the video line selecting pulse voltage $\phi_S$ for controlling the switching transistor 22.

The control gate 4, the insulator 6 and the gate electrode 7 constitute the capacitor which is connected to the gate. The insulator 6 need not be limited specifically to SiO$_2$ but may also be Sl$_3$N$_4$, Al$_2$O$_3$, tantalum oxide or a composite film thereof.

The operation of this structure is the same as the device of FIG. 1(b).

For obtaining the static induction transistor, the impurity density of the n− region of the channel is selected lower than about $1 \times 10^{16}$ cm$^{-3}$ and the impurity densities of the gate, source and drain regions are selected higher than around $1 \times 10^{18}$ m$^{-3}$. In order that no drain current may flow even if the gate electrode is zero, the sizes and the impurity densities of respective regions are selected so that the regions between adjacent gate regions and the channel region may be depleted by a diffusion potential alone. It is needless to say that this can easily be achieved by increasing the thickness of the gate to reduce the gate spacing. For the light amplification, care should be taken not to introduce a dislocation, a defect and so forth in crystal in each manufacturing step; for example, in the case of diffusing boron for the formation of the p+ gate, the group IV atom is used to compensate for lattice distortions for preventing them. In order to prevent easy recombination of the optically excited electron-hole pairs, it is necessary that the n− region of the channel be long-lived and, to this end, gettering for heavy metals is carried out in the final stage of the manufacturing process to thereby increase the lifetime of the channel region. The read address circuit 20 and the video line selecting circuit 21 can each be formed by a shift register.

Figure 1D:
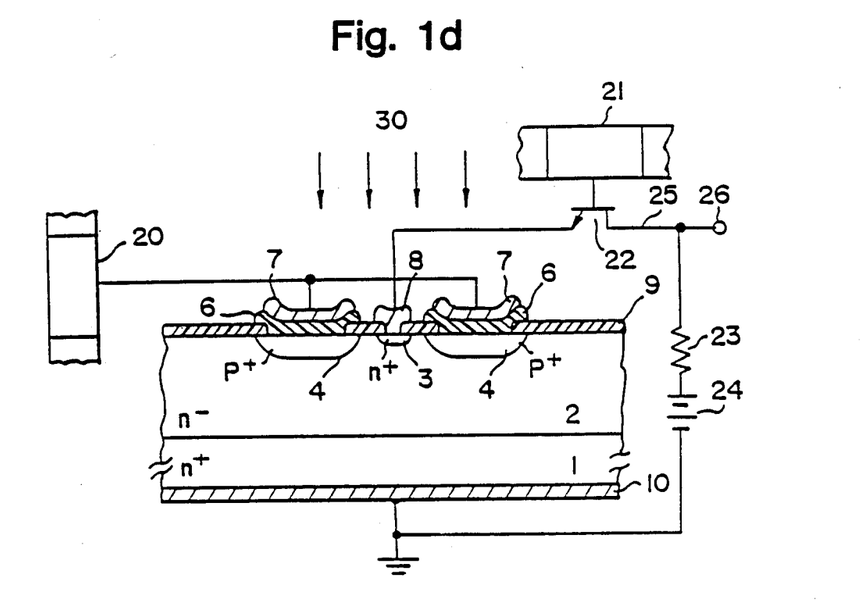

FIG. 1(d) is a modified form of the structure of FIG. 1 (c), in which the source and drain electrodes are reversed and a substrate electrode 10 is used as the source.

In the case of integrating the read address circuit 20, the video line selecting circuit 21, the switching transistor 22, the load resistor 33, the lead 25 and the output terminal 26 as peripheral circuits on the same substrate, a more convenient one of the circuit structures of FIGS. 1(c) and (d) may be selected. The switching transistor 22 as the peripheral circuit may be the normally OFF type static induction transistor as is the case with the cell, or a MOS transistor. The read address circuit 20 and the video line selecting circuit 21 may also be of the same circuit structure as an ordinary random access memory (RAM).

Figure 1E:
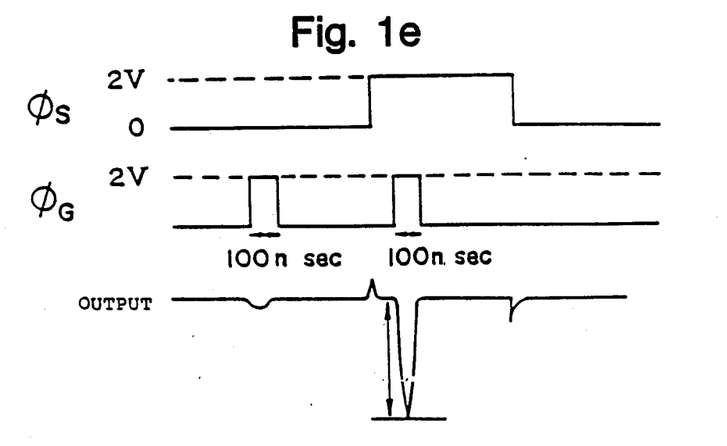
FIG. 1(e) is a diagram explanatory of the operation of the semiconductor image sensor of the present invention.

FIG. 1(e) is a diagram showing the operation of the semiconductor image sensor of the present invention. The switching transistor is the normally OFF type static induction transistor. Reference character $\phi_G$ indicates a readout gate pulse voltage, and $\phi_S$ a video line selecting pulse voltage. It is seen from FIG. 1(e) that when light is irradiated to write light information and the video line selecting pulse voltage $\phi_G$ is provided, the column line of the cell to be read out is selected and, only when the pulse voltages $\phi_S$ and $\phi_G$ are applied simultaneously, is an output signal produced. At this time, the pulse voltage $\phi_S$ is 2 V, the pulse voltage $\phi_G$ is 2 V and video voltage is 6.10 V, but even if the video voltage is 2 V or so, the semiconductor image sensor of the present invention operates. It has been found that the semiconductor image sensor of the present invention operates on a very low voltage. Further, the readout speed is less than 100 nsec per cell and, accordingly, the semiconductor image sensor of the present invention can be made of large-capacity. Since the normally OFF type static induction transistor is used, the power sources for the pulse voltages $\phi_S$ and $\phi_G$ and the drain power source may be of the same polarity.

Figure 1F:
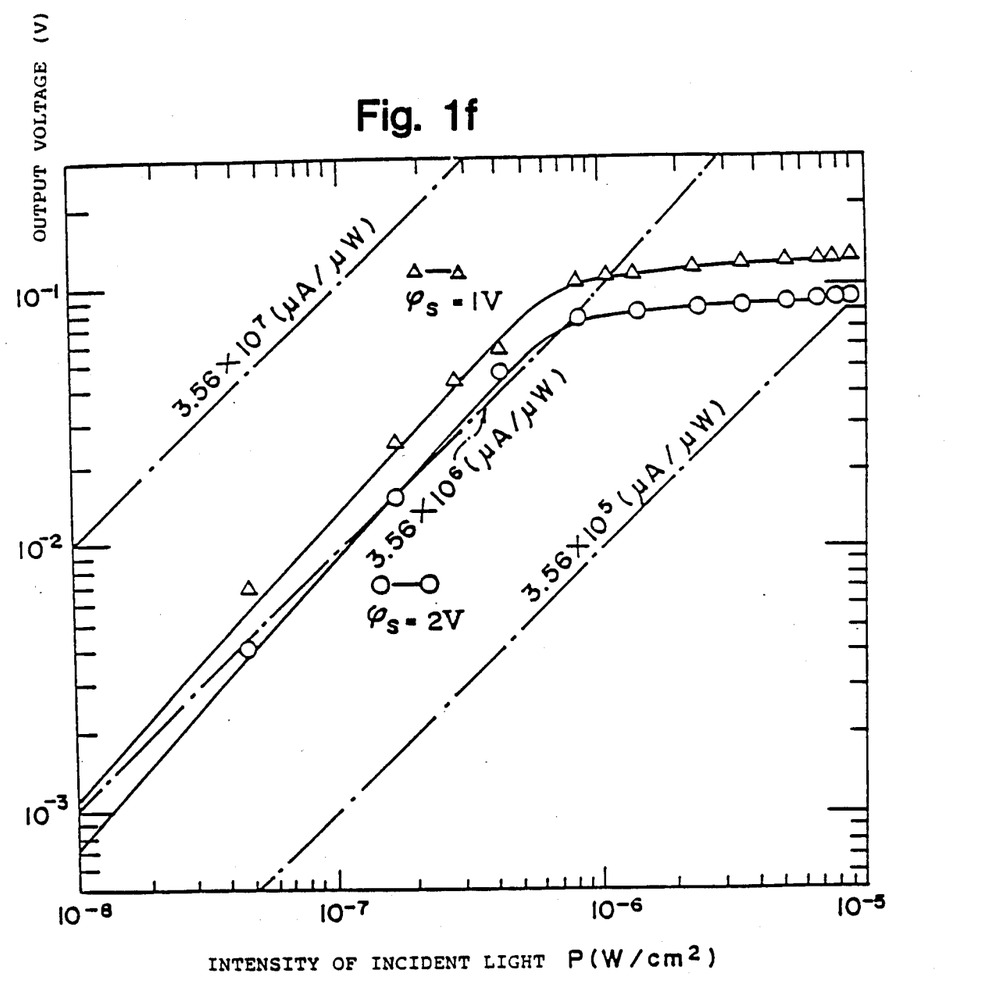
FIG. 1(f) is a graph showing an example of a dynamic characteristic of this invention device.

FIG. 1(f) shows an example of the dynamic characteristic of light. The size caused by the photo cell is 50 $\mu$m$\times$55 $\mu$m. The time for irradiation by light is 25 msec. The applied pulse voltages $\phi_S$ and $\phi_G$ are both 1 V, the video voltage is 6.1 V, a load resistance $R_L$ is 1 K$\Omega$ and the capacitance of the capacitor connected to the gate is about 5 pF. In view of the relation between the intensity of incident light and the output voltage, it is seen that the semiconductor image sensor of the present invention is very highly sensitive. In particular, it is seen that linearity on the side of low-intensity light is two or more orders of magnitude over that on the side of high-intensity light. Similar results were also obtained in the case of using, as the transistor of the photocell, such a static induction transistor in which no drain current flows when a gate voltage is applied.

Figure 2A:
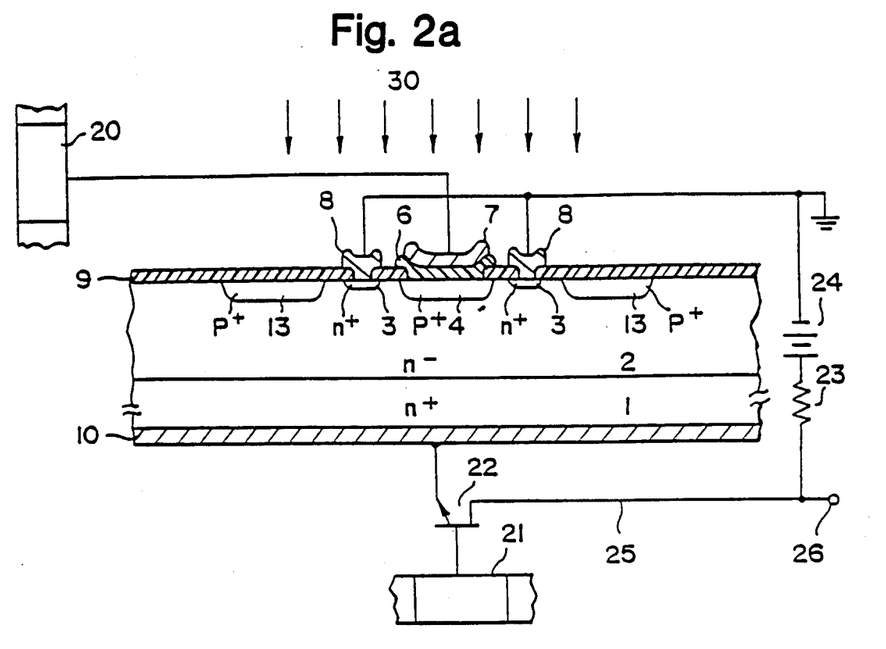
FIGS. 2(a) and (b) are cross-sectional views of the principal parts of photocell with a shielding gate.

FIGS. 2(a) and (b) illustrate other embodiments of the present invention, which are identical in construction with the embodiments of FIGS. 1(c) and (d) except that the photocell has two gate regions. On the control gate 4 is formed a capacitor made up of the insulator 6 and the gate electrode 7. Reference numeral 13 indicates a shielding gate, which is formed to surround the control gate 4 and the n+ source region 3. The control gate 4 and the shielding gate 13 constitute a potential barrier in the channel. Electrons of the electronhole pairs created by the light input 30 flow into the ground potential, but the holes are stored in the gate region 4 and the floating gate 13. In the drawings only one photocell is shown, but when a number of photocell are formed, the p+ shielding gate 13 has the function of isolating each cell by a depletion layer from adjacent the ones. A certain potential may sometimes be applied between the floating gate 13 and the source, or the floating gate may also be made equipotential to the source.

Figure 2B:
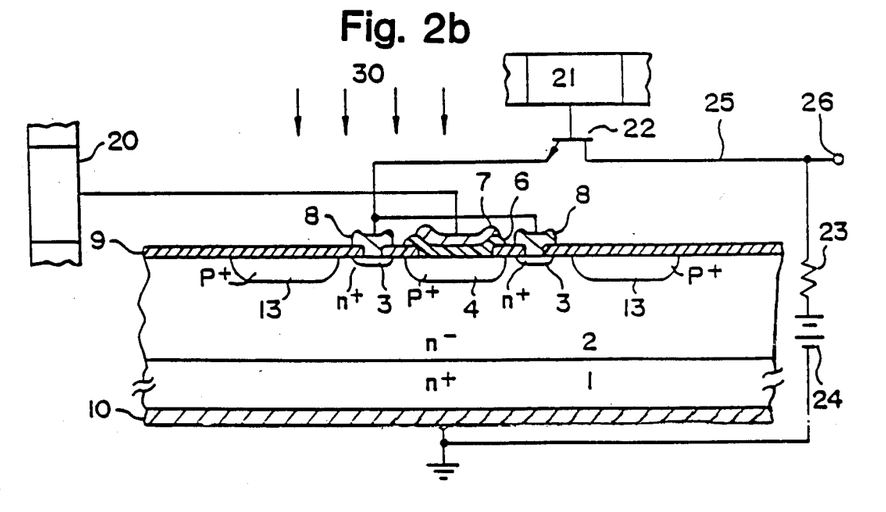

FIGS. 2(a) shows an embodiment in which the n+ region 3 is used as the source region, and FIG. 2(b) an embodiment in which the n+ region 3 is used as the drain region.

FIGS. 3(a) through (d) illustrate embodiments of the present invention as applied to a semiconductor image sensor for image processing.

Figure 3A:
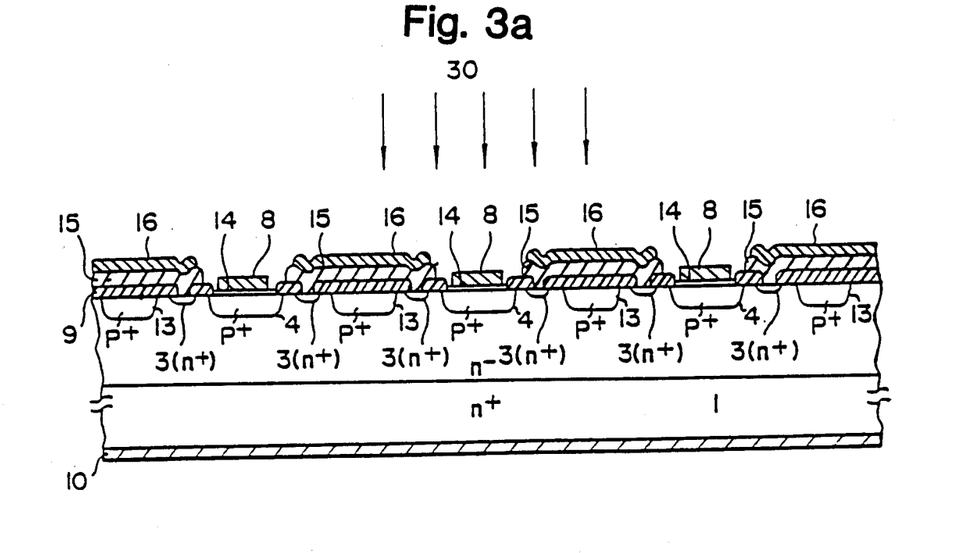
FIG. 3(a) is a cross-sectional view of a photocell matrix in the semiconductor image sensor of the present invention in which a number of photocells are arranged.
Figure 3B:
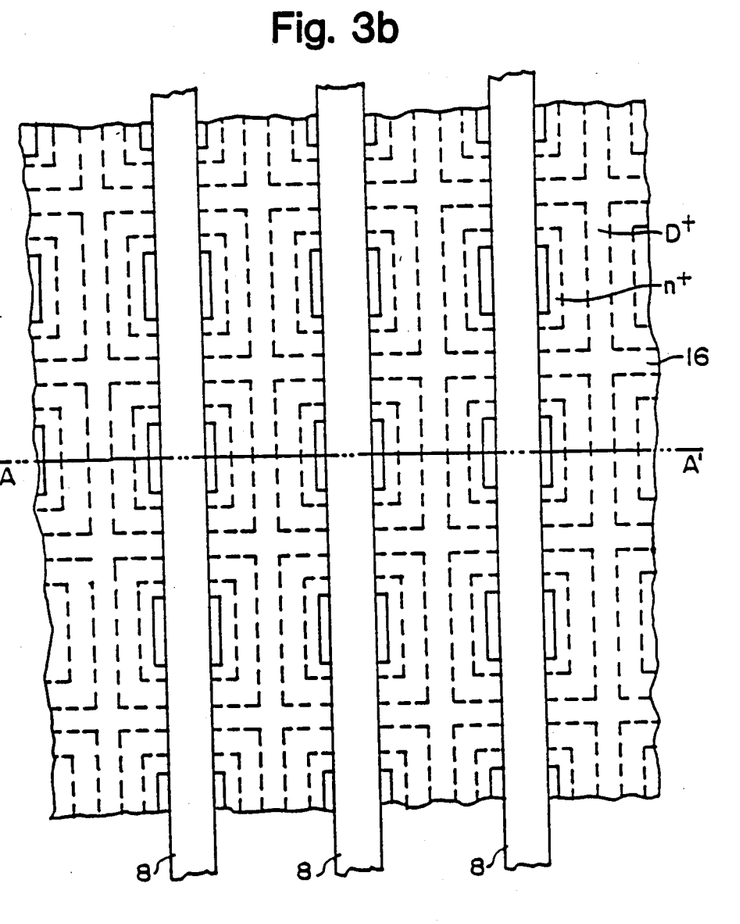
FIG. 3(b) is a top plan view of the photocell matrix.

FIG. 3(a) is a cross-sectional view of the photo cell portion taken on the line A—A' in FIG. 3(b) (the dimensions not being the same). Reference numeral 1 indicates an n+ substrate of silicon, 2 a high resistance n− layer (or an intrinsic semiconductor region), 3 a high impurity density n+ region which is the source region (or the drain region), 4 a control gate region formed by a high impurity density p+ region, and 13 a floating gate. These regions are identical with those in the embodiment of FIG. 2. On the wafer surface are disposed a control gate electrode 8 and an electrode 16 of the n+ region 3 which will ultimately form the source or drain. Reference numeral 14 denotes a thin insulator layer as of SiO, and a capacitor is formed between the gate electrode 8 and the control gate region 4. Reference numeral 9 indicates an SiO film, and 15 phosphorus-doped polysilicon which interconnects the source regions of respective photocells. Reference numeral 16 denotes a phosphorus-doped phosphosilicate glass (PSG) layer, which is provided for insulating the gate electrode 8 and the polysilicon 15 of the source region.

FIG. 3(b) is a top plan view of FIG. 3(a). Reference numeral 8 indicates aluminum lines of the gate electrodes. The n+ regions and the gate regions are indicated by the broken lines. The surface is covered with the PSG film. The control p+ gate region and the thin insulating film 14 for the capacitor (FIG. 3(a)) underlie the gate electrode 8.

Figure 3C:
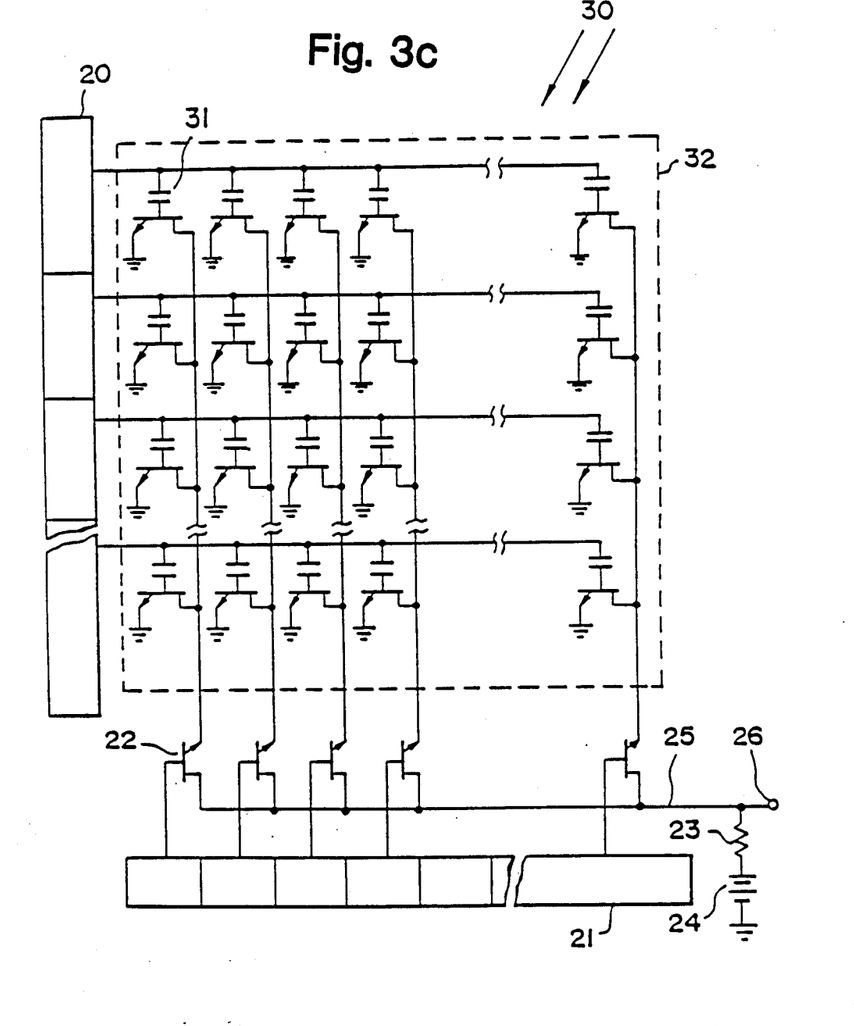
FIGS. 3(c) and (d) are diagrams showing the arrangement of the semiconductor image sensor of the present invention which performs a two-dimensional image sensing operation.

FIG. 3(c) illustrates an embodiment of the present invention which is formed by an arrangement 32 of static induction transistors of FIGS. 3(a) and (b) in a matrix form and which is capable of two-dimensional image detection. Reference numeral 22 indicates a switching transistor for video line selection, which is an example of the normally OFF type static induction transistor. Reference numeral 21 denotes a video line selecting circuit which provides the pulse voltage $\phi_S$, 20 a read address circuit which provides the pulse voltage $\phi_G$, 23 a load resistor, and 24 a video voltage source.

By irradiation of the light input 30, the video line selecting circuit and the read address circuit derive in succession at an output terminal 26 signals of photocells which form the matrix. By sequentially transmitting the outputs at the output terminal 26 to a display circuit, an image output can be obtained.

Figure 3D:
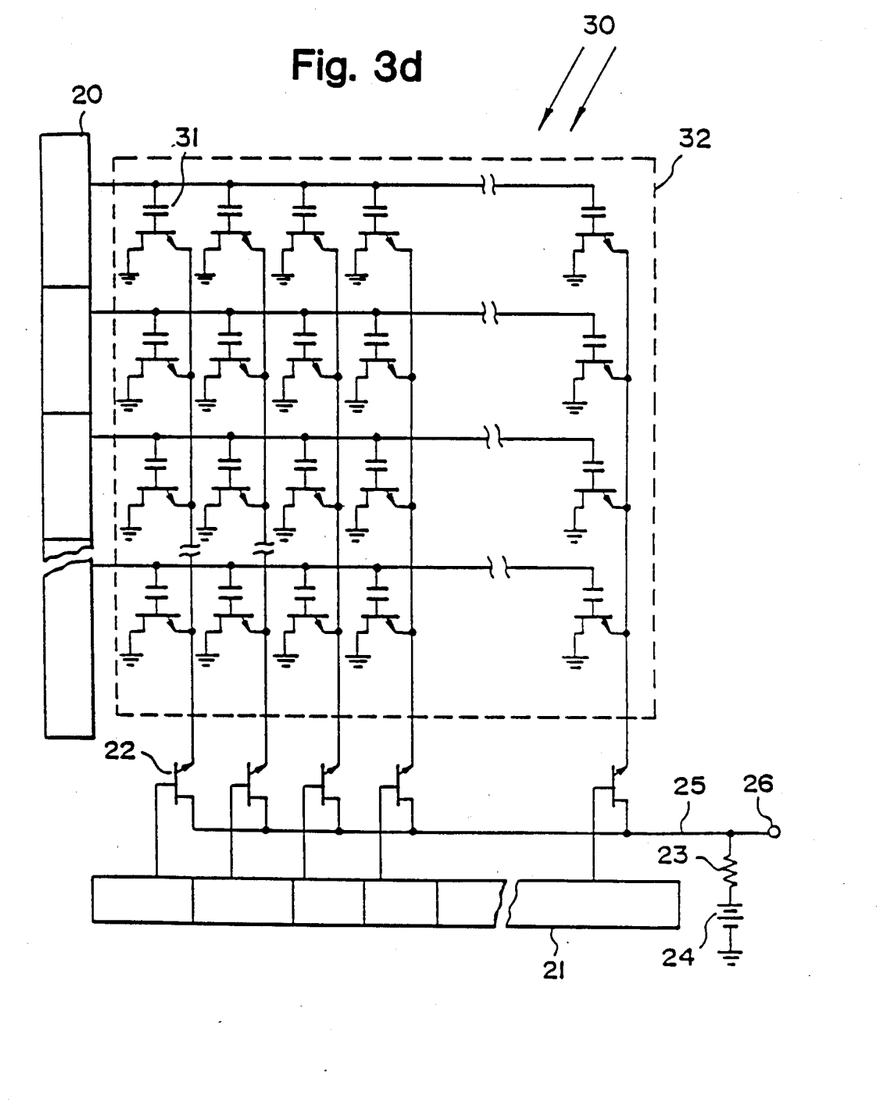

The device of FIG. 3(d) is identical with the device of FIG. 3(c) except that the n+ region 3 is used as the drain and the n+ substrate is used as the source region in FIG. 3(a). It is also possible to integrate the matrix of the photo cells and the peripheral circuits. When it is desired to obtain a color display, a semiconductor image sensor for color display can be obtained by separating the photocell array 32 through using color filters, for instance, by providing red (R), green (g) and blue (B) cells to take out signals of R, G and B.

Figure 4A:
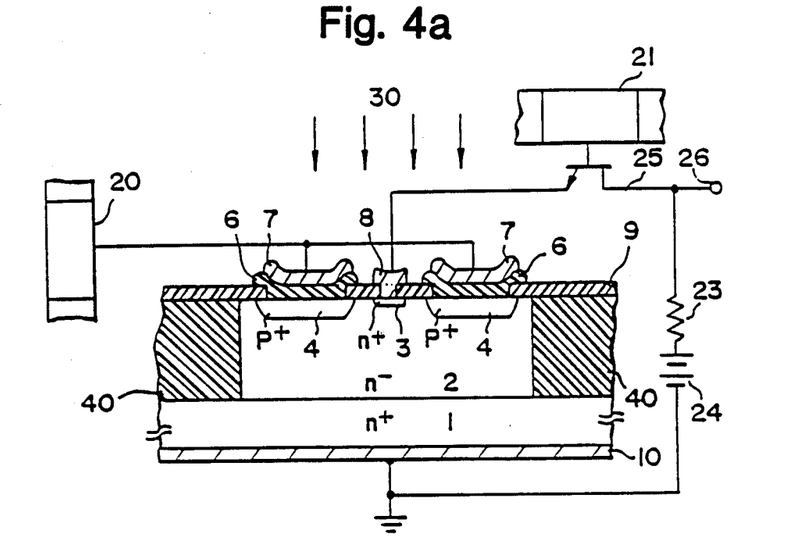
FIGS. 4(a) and (b) are cross-sectional views of the principal parts of other examples of photocell for use in the present invention.
Figure 4B:
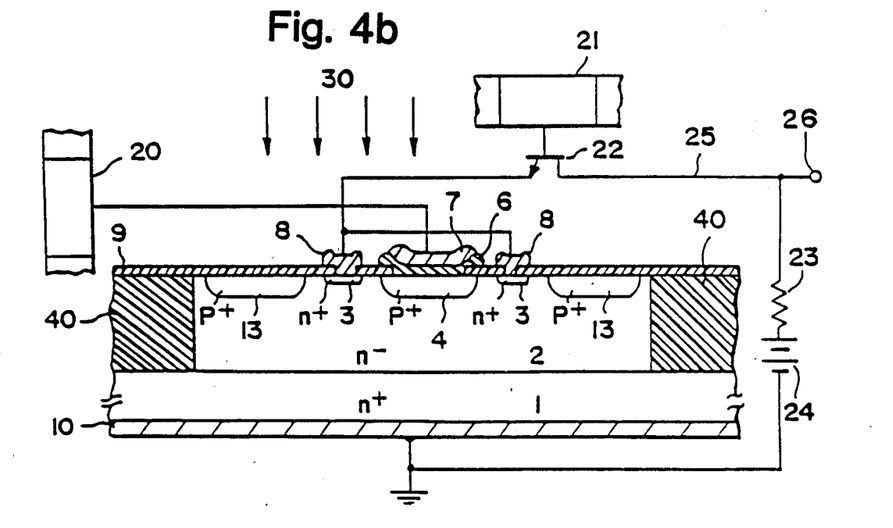
Figure 4C:
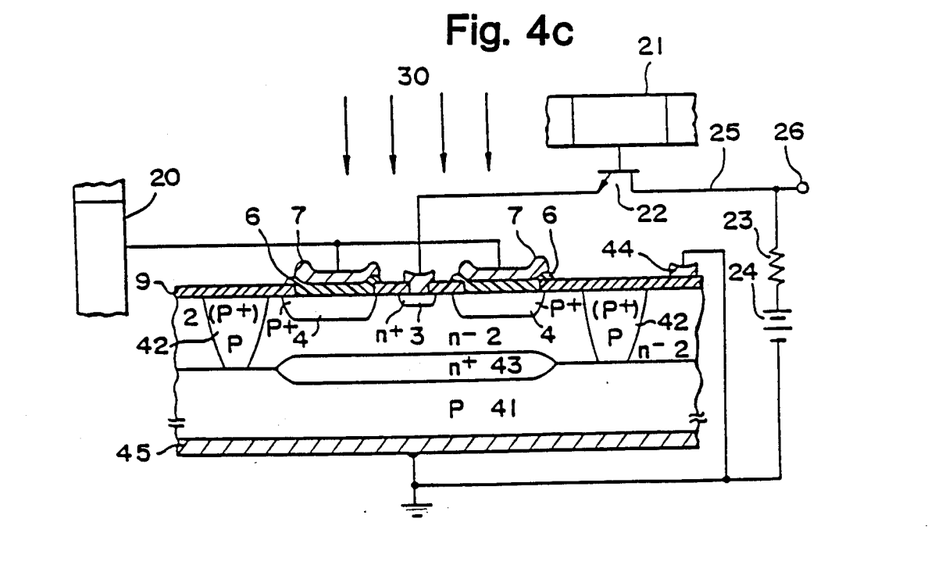

FIGS. 4(a) through (c) illustrate other embodiments of the present invention, showing isolation of each photocell portion.

In FIGS. 4(a) and (b), the photocell in the embodiments of FIGS. 1(d) and 2(b) are isolated by insulating material layers 40. The insulating material layers are formed of SiO or the like.

FIG. 4(c) uses a p substrate 41 for isolating the photocells in the embodiment of FIG. 2(b) by a p-n junction. Reference numeral 42 indicates a p or p+ region, which is connected to the p substrate 41. Reference numeral 43 denotes an n+ region, which is the source or drain region. Reference numeral 44 designates a source electrode which connects the source region 43 to the wafer surface by an n region. The p (p+) region 41 and the source region 43 may also be connected together and grounded via the source electrode as illustrated.

It is needless to say that the read address circuit and the video line selecting circuit can be integrated on the same substrate, along with the photocell matrix through utilization of known integrated circuit techniques other than the abovesaid isolation method.

With the present invention, it is possible to obtain a semiconductor image sensor of the type that each cell is formed by one transistor and one capacitor through using the static induction transistor.

While the embodiments have been described in connection with the case where the transistor used is an n-channel one, it is needless to say that a p-channel transistor can also be used. Also it is possible to employ an SIT whose channel is reverse in conductivity type. The gate may also be a Schottky barrier gate or MOS (MIS) gate. The material need not be limited specifically to silicon but may also be germanium and the group III-V compound semiconductors. It is needless to say that wiring on the surface of the photocell array may be effected by conventional digital memory techniques, such as double wiring of an aluminum line or the like.

I claim:

1. A semiconductor image sensor comprising:
   a matrix corresponding to intersections of a plurality of row lines and a plurality of column lines on a substrate;
   a static induction transistor photocell provided with said substrate for each said intersection, each said photocell including
      a first main electrode connected to one of the column lines,
      a second main electrode connected in common to the second main electrodes of the other photocells,
      a channel region disposed in said substrate between the first and second main electrodes,
      a control region in said substrate, and
      a capacitor connected between said control region and a respective one of said row lines;
   a respective switching transistor for each said column line, each including
      a control electrode,
      a first main electrode connected to the respective column line, and
      a second main electrode connected in common to the second main electrodes of the other switching transistors;
   a respective video line selecting circuit for each said column line, each connected to the control electrode of the respective switching transistor; and
   a respective read address circuit for each said row line, connected to the gate electrode of each respective photocell via the respective capacitor wherein said substrate includes a lightly doped layer of a first conductivity type in which each said channel region is formed, and each said transistor photocell has as its source or drain a first region of said first conductivity type but of higher conductivity than said lightly doped layer, each said first region being connected to a respective one of said first and second main electrodes of the respective photocell transistor and each said control region is formed of a second conductivity type that is opposite said first conductivity type.

2. The sensor of claim 1, said substrate including a layer of said first conductivity type beneath said lightly doped layer and of higher conductivity than said lightly doped layer, which layer is connected to the other one of the first and second main electrodes of each said transistor photocell.

3. The sensor of claim 1, each said transistor photocell comprising two of said control regions and respective capacitors.

4. The sensor of claim 1, each said transistor photocell having only a single one of said control regions with the respective capacitor, said sensor comprising further regions in said substrate of said second conductivity type, said further regions being separated from the respective channel region by the respective control region.

5. The sensor of claim 4, each said transistor photocell comprising two of said highly doped regions of said first conductivity type as the respective one of said source or drain.

6. The sensor of claim 1, wherein said substrate includes means for isolating between each said transistor photocell.

7. The sensor of claim 1, wherein a series connection of a power source and a load resistor is connected to said common connection of said second main electrodes of said switching transistors.

8. The sensor of claim 1, said first conductivity type being n type, wherein each said channel region is depleted depending on holes stored in the respective control region.

9. The sensor of claim 1, said first main electrode of each said photocell being a drain electrode.

10. The sensor of claim 8, said first main electrode of each said photocell being a source electrode.

11. A photocell comprising
a semiconductor substrate including a lightly doped layer for providing a channel region,
a first highly conducting region of a first conductivity type at the top surface of said substrate to serve as a predetermined one of a source and drain and a second highly conducting region of said first conductivity type formed in said substrate so as to be separated from said first highly conductive region by a part of said lightly doped layer including said channel region,
a control region formed in the surface of said substrate in the vicinity of said highly conducting region at said top surface,
a capacitor plate formed over said control region with an insulating layer therebetween,
means for applying a forward voltage between said first and second highly doped regions, and for applying a pulse to said capacitor plate,
wherein the amount of incident light results in a corresponding amount of majority carriers being stored in said control region to effect corresponding depletion of said channel region, so that a corresponding current flows responsive to said forward voltage and the pulse applied to said capacitor plate as a result of the level of said incident light.

12. An array of photocells of the type of claim 13, arranged in column and now directions, said second highly doped region being provided by at least one respective part of said substrate beneath said lightly doped layer and under the respective channel region, said array comprising means for reading out said photocells including address read out means for selecting a row by applying said voltage pulse to all of the capacitor plates of the respective row, and a video line select for applying said forward voltage in common to said highly doped regions of the photocells of a respective column.

* * * * *